United States Patent (10) Patent No.: US 7,750,422 B2
Watanabe et al. (45) Date of Patent: *Jul. 6, 2010

(54) SOLID STATE IMAGE PICKUP APPARATUS AND RADIATION IMAGE PICKUP APPARATUS

(75) Inventors: Minoru Watanabe, Honjo (JP); Masakazu Morishita, Hiratsuka (JP); Chiori Mochizuki, Sagamihara (JP); Takamasa Ishii, Honjo (JP); Keiichi Nomura, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/685,044

(22) Filed: Mar. 12, 2007

(65) Prior Publication Data
US 2007/0146520 A1 Jun. 28, 2007

Related U.S. Application Data

(62) Division of application No. 10/538,774, filed on Jun. 10, 2005, now Pat. No. 7,205,568.

(30) Foreign Application Priority Data

Feb. 14, 2003 (JP) ............................. 2003-036835

(51) Int. Cl.
*H01L 31/0224* (2006.01)
(52) U.S. Cl. ........................ 257/431; 257/225; 257/231; 257/E31.041; 257/E31.054; 348/298
(58) Field of Classification Search ................. 257/187, 257/225, 231, 431, 444, 448, E31.041, E31.054; 348/298
See application file for complete search history.

(56) References Cited

U.S. PATENT DOCUMENTS 5,962,856 A 10/1999 Zhao et al. ............. 250/370.09

(Continued)

FOREIGN PATENT DOCUMENTS

JP 2-260460 10/1990

(Continued)

OTHER PUBLICATIONS

Korean Official Letter issued in counterpart application and translation.

*Primary Examiner*—Davienne Monbleau
*Assistant Examiner*—Eduardo A Rodela
(74) *Attorney, Agent, or Firm*—Fitzpatrick, Cella, Harper & Scinto

(57) ABSTRACT

In a solid state image pickup apparatus with a photodetecting device and one or more thin film transistors connected to the photodetecting device formed in one pixel, a part of the photodetecting device is formed over at least a part of the thin film transistor, and the thin film transistor is constructed by a source electrode, a drain electrode, a first gate electrode, and a second gate electrode arranged on the side opposite to the first gate electrode with respect to the source electrode and the drain electrode, and the first gate electrode is connected to the second gate electrode every pixel, thereby, suppressing an adverse effect of the photodetecting device on the TFT, a leakage at turn-off TFT, variation in a threshold voltage of the TFT due to an external electric field, and accurately transferring photo carrier to a signal processing circuit.

12 Claims, 12 Drawing Sheets

U.S. PATENT DOCUMENTS

| | | | |
|---|---|---|---|
| 6,069,393 A | 5/2000 | Hatanaka | 257/434 |
| 7,148,487 B2 * | 12/2006 | Ishii et al. | 250/370.14 |
| 7,205,568 B2 * | 4/2007 | Watanabe et al. | 257/59 |
| 2001/0022363 A1 | 9/2001 | Nagata et al. | 257/59 |
| 2002/0053946 A1 | 5/2002 | Huang | 330/127 |
| 2002/0084419 A1 | 7/2002 | Choo et al. | 250/370.01 |
| 2003/0226974 A1 | 12/2003 | Nomura et al. | 250/370.11 |
| 2005/0179964 A1 | 8/2005 | Izumi | 358/483 |
| 2005/0274991 A1 | 12/2005 | Ishii et al. | 250/370.11 |
| 2006/0001120 A1 * | 1/2006 | Wright | 257/452 |
| 2006/0062352 A1 | 3/2006 | Nomura et al. | 257/225 |
| 2006/0065944 A1 | 3/2006 | Mochizuki et al. | 257/444 |
| 2006/0119548 A1 * | 6/2006 | Lan et al. | 345/76 |
| 2006/0249763 A1 | 11/2006 | Mochizuki et al. | 257/291 |

FOREIGN PATENT DOCUMENTS

| | | |
|---|---|---|
| JP | 6-216359 | 8/1994 |
| JP | 2001-250932 | 9/2001 |
| JP | 14-124655 | 4/2002 |
| JP | 2002-124655 | 4/2002 |
| JP | 2002-368202 | 12/2002 |
| KR | 2001-108843 | 9/2001 |
| TW | 521433 | 2/2003 |

* cited by examiner

SOLID STATE IMAGE PICKUP APPARATUS AND RADIATION IMAGE PICKUP APPARATUS

CROSS-REFERENCE TO RELATED APPLICATIONS

This application is a divisional of U.S. patent application Ser. No. 10/538,774, filed Jun. 10, 2005, now U.S. Pat. No. 7,205,568, which was the national phase of international application PCT/JP2004/001431, filed Feb. 10, 2004, and claims benefit of the filing date of that application, and priority benefit of the filing date of Japanese Patent Application 2003-036835, filed Feb. 14, 2003. The entire disclosure of each of those prior applications is incorporated herein by reference.

TECHNICAL FIELD

The invention relates to a solid state image pickup apparatus having photodetecting devices and thin film transistors (TFTs) and a radiation image pickup apparatus. The solid state image pickup apparatus is used in the radiation image pickup apparatus for detecting a radiation such as X-ray, α-ray, β-ray, γ-ray, or the like in a medical image diagnosing apparatus, a non-destructive inspecting apparatus, an analyzing apparatus, or the like.

BACKGROUND ART

In recent years, the realization of a large size of a TFT matrix panel in which TFTs are formed on an insulating substrate and the realization of a high driving speed have rapidly been being progressed. A manufacturing technique of a liquid crystal panel using TFTs is used for an area sensor as a solid state image pickup apparatus having photodetecting devices each for converting visible light into an electric signal. By arranging a converting layer for converting an X-ray (radiation) into a visible light beam onto the surface, such an apparatus is also used as a radiation image pickup apparatus. According to such a panel which reads a light irradiation amount, unlike an image display apparatus such as a liquid crystal panel, it is particularly important to accurately transfer charges accumulated in each pixel. However, for example, if a threshold voltage of the TFT is changed due to an external action, an image variation occurs in a fetched image. In the radiation image pickup apparatus, therefore, the following conditions are required of the photodetecting devices and the TFTs.

(1) An amount of light irradiated every device is accurately accumulated as charges.

(2) The charges accumulated in each device are accurately transferred.

Owing to the progress of the recent technique of TFTs for liquid crystal displays, there has been proposed a radiation image pickup apparatus formed by combining: a sensor array constructed by photodetecting devices using amorphous silicon (hereinbelow, abbreviated to a-Si) and switching TFTs; and a phosphor for converting a radiation into visible light or the like. Digitization has also been accomplished in a medical image field. Since a radiation image can be momentarily read out, instantaneously displayed onto a display, and fetched as digital data by such a radiation image pickup apparatus, storage, modification, transfer, and the like of the data can be performed. However, for example, according to a bottom gate type TFT, since source-drain electrodes and a channel portion of the TFT are arranged in the upper portion, there is a feature such that it is influenced by an external action and the threshold voltage changes. Particularly, if the photodetecting device is arranged, for example, in such a form as to cover the TFT in order to improve a numerical aperture, a back channel effect is obtained for the TFT by an influence of electrons or holes which are generated in the photodetecting device and a phenomenon such that the threshold voltages of the TFTs of the pixels are different occurs.

Therefore, for example, in a solid state image pickup apparatus in which a photodetecting device is arranged to an upper portion of a TFT, it is necessary to cover a channel upper portion of the TFT with an electrode.

As a conventional example, according to a proposition of Japanese Patent Application Laid-Open No. 6-216359 by Casio Computer Co., Ltd., a TFT device has a structure in which a source electrode and a drain electrode are sandwiched by a top gate electrode and a bottom gate electrode. In the patent literature 1, since it has the structure in which a semiconductor layer of the TFT device is also used as a photoelectric converting layer, it is difficult to obtain preferable values with respect to both of characteristics such as a switching speed and the like of the TFT and converting efficiency as a photoelectric converting device and there is a relation of tradeoff between them.

DISCLOSURE OF THE INVENTION

The invention is made in consideration of the above problems and it is an object of the invention to provide a solid state image pickup apparatus of low costs and high performance which comprises photodetecting devices and thin film transistors and has a structure in which the photodetecting device covers a part or a whole surface of the thin film transistor, particularly, in order to form a large opening portion of the photodetecting device, while the stable thin film transistor of high performance which accurately transfers generated charges to a signal processing circuit is provided, and characteristics of both of the thin film transistor and the photodetecting device can be independently set.

A solid state image pickup apparatus of the invention is characterized in that a photodetecting device and one or more thin film transistors connected to the photodetecting device are formed in one pixel, a part of the photodetecting device is formed over at least a part of the thin film transistor, the thin film transistor comprises a source electrode, a drain electrode, a first gate electrode, and a second gate electrode arranged on the side opposite to the first gate electrode with respect to the source electrode and the drain electrode, and the first gate electrode is connected to the second gate electrode every pixel.

Thus, it is possible to provide the stable thin film transistor of high performance in which an influence of the photodetecting device formed over the upper portion of the TFT is eliminated, when the TFT is turned off, a leakage is small, and a threshold voltage of the TFT is not changed by an electric field from an outside but generated charges are accurately transferred to a signal processing circuit. In addition, the solid state image pickup apparatus of low costs and high performance in which the characteristics of both of the thin film transistor and the photodetecting device can be independently set can be provided. Since the TFT can be controlled by the two gate electrodes, the number of channels of the TFT increases and it also contributes to the improvement of transfer efficiency of the charges.

Other features and advantages of the present invention will be apparent from the following description taken in conjunction with the accompanying drawings, in which like reference characters designate the same or similar parts throughout the figures thereof.

BRIEF DESCRIPTION OF THE DRAWING

The accompanying drawings, which are incorporated in and constitute a part of the specification, illustrate embodiments of the invention and, together with the description, serve to explain the principles of the invention.

BEST MODES FOR CARRYING OUT THE INVENTION

A solid state image pickup apparatus and a radiation image pickup apparatus according to embodiments of the invention will be specifically explained hereinbelow.

Embodiment 1

FIGS. 1 to 5 show plan views and cross sectional views of one pixel of an embodiment 1 of the invention.

Figure 1:
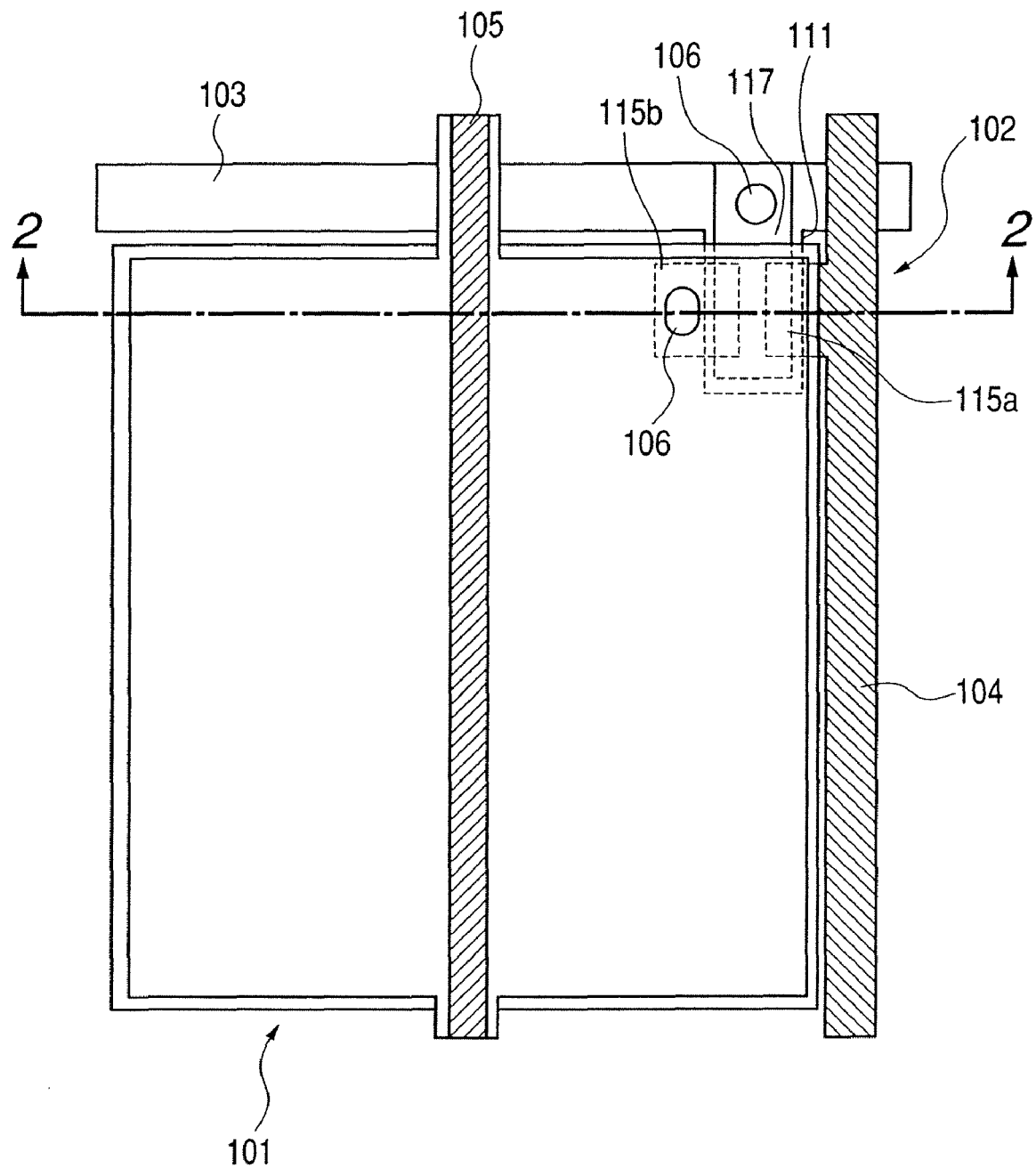
FIG. 1 is a plan view of a pixel of a solid state image pickup apparatus in an embodiment 1 of the invention.

FIG. 1 is a layout diagram showing a plane structure of a pixel including a pair of a photodetecting device and a TFT in the solid state image pickup apparatus according to the embodiment 1 of the invention.

The photodetecting device of the embodiment is a device for converting visible light into charges and a phosphor layer as a wavelength converter for converting a radiation into the visible light is arranged in an upper portion of the device.

A TFT (thin film transistor) 102 is constructed by four electrodes: a source electrode; a drain electrode; a first gate electrode; and a second gate electrode. A transfer wiring 104 connected to a signal processing circuit for reading accumulated charges is connected to a source electrode 115a of the TFT. A gate wiring 103 connected to a gate driver circuit for controlling ON/OFF of the TFT is connected to a first gate electrode 111 and also connected to a second gate electrode 117 via a through-hole 106 every pixel. Further, a photodetecting device 101 is MIS type photodetecting device constructed sequentially from the bottom by an electrode layer, an insulating layer, an intrinsic semiconductor layer, and an n-type semiconductor layer. One of the two electrodes constructing the photodetecting device is connected to a drain electrode 115b of the TFT and the other electrode is connected to a bias wiring 105 for applying a voltage to a sensor.

As mentioned above, by sandwiching a channel portion between the source electrode and the drain electrode of the TFT 102 by the first gate electrode 111 and a second gate electrode 117, even if electrons and holes are generated in the photodetecting device 101 arranged in the upper portion of the TFT 102 and an electric potential of the electrodes constructing the photodetecting device fluctuates, the TFT 102 existing in the lower portion is not influenced and characteristics do not fluctuate. The gate wiring 103 can be formed by a first electrode layer which is used in the first gate electrode 111 or can be also formed by a third electrode layer which is used in the second gate electrode 117. However, to reduce a capacitance formed in a portion between the gate wiring 103 and the transfer wiring 104, the bias wiring 105, or a lower electrode of the photodetecting device 101, it is desirable to form it by the first electrode layer which is used in the first gate electrode 111.

In the embodiment, particularly, in the case where a material for photoelectrically converting the visible light is used for a photodetecting device, it is desirable that the light does not enter the gap portion between the source and the drain of the TFT. Therefore, it is desirable that a lower electrode layer which is used for the lower electrode of the photodetecting device which is arranged in the upper portion of the TFT and the electrode layer which is used as a second gate electrode of the TFT is not formed by a transparent electrode layer such as ITO or the like but a metal layer such as Al or Mo which does not transmit the light is used.

Figure 2:
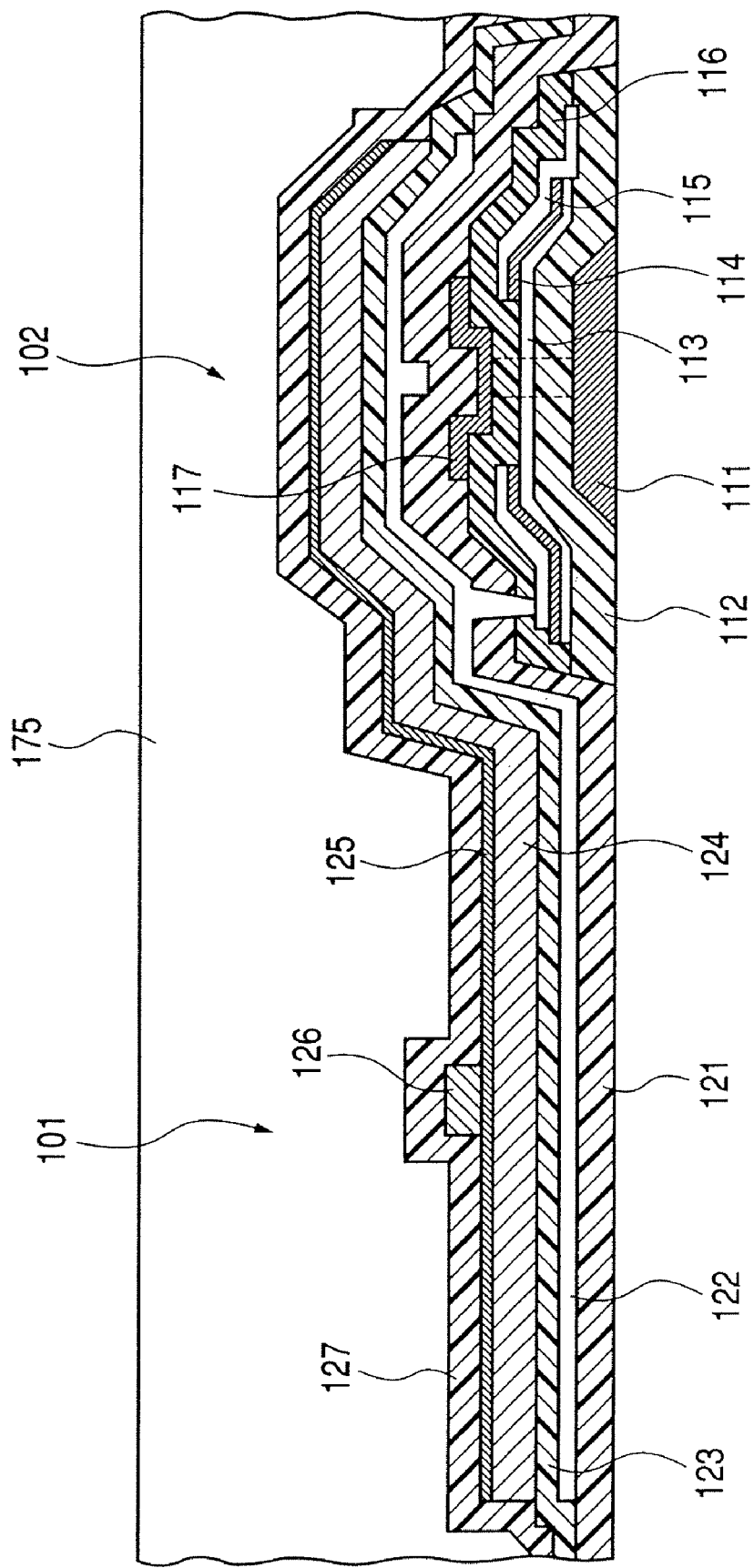
FIG. 2 is a cross sectional view taken along the line 2-2 in FIG. 1.

FIG. 2 is a cross sectional view taken along the line 2-2 in FIG. 1.

Each layer is formed on an insulating substrate (not shown). A phosphor layer 175 is arranged in an upper portion. The TFT 102 is arranged in a right portion. The photodetecting device 101 is arranged in a left portion so as to cover the TFT 102 in the right portion. The TFT 102 has a structure of a bottom gate type and is constructed sequentially from the bottom by: the first gate electrode 111 comprising the first electrode layer; source-drain electrodes comprising a first insulating layer 112, a first intrinsic semiconductor layer 113, a first n-type semiconductor layer 114, and a second electrode layer 115; and the second gate electrode 117 comprising a second insulating layer 116 and a third electrode layer.

The photodetecting device 101 is constructed sequentially from the bottom by: a fourth electrode layer 122; a fourth insulating layer 123; a second intrinsic semiconductor layer 124; and a second n-type semiconductor layer 125. A bias wiring comprising a fifth electrode layer 126 which has a low resistance and to which a bias can be applied is connected to the second n-type semiconductor layer 125. Such a structure is possible in the case where a resistance of the n-type semiconductor layer is low, for example, like a microcrystal n-type semiconductor layer. If the resistance of the n-type semiconductor layer is high like an amorphous silicon n-type semiconductor layer, it is necessary to form an electrode layer onto the whole upper surface of the n-type semiconductor layer. It is preferable that, for example, an ITO layer serving as a transparent electrode layer which sufficiently transmits the visible light is used as such an electrode layer. The drain electrode of the TFT 102 (the left portion of the second electrode layer 115 in FIG. 2) is connected to an electrode comprising the fourth electrode layer 122 of the photodetecting device 101. A third insulating layer 121 is arranged in a lower portion. A fifth insulating layer 127 is arranged in an upper portion.

In the solid state image pickup apparatus of such a structure, when the visible light converted in the phosphor from the radiation enters the photodetecting device 101, electrons and holes are generated in the intrinsic semiconductor layer. For example, if the second n-type semiconductor layer 125 of the photodetecting device 101 or the electrode layer which is arranged in its upper portion and uses, for example, ITO has been fixed to a predetermined electric potential, a potential fluctuation is caused in the lower electrode of the photodetecting device 101 comprising the fourth electrode layer 122. Although an image can be displayed by reading the potential fluctuation via the TFT, if such a potential fluctuation occurs on the gap portion between the source and the drain of the TFT, a back channel effect of the TFT is caused and it becomes a factor which changes a threshold voltage of the TFT. Therefore, the second gate electrode 117 comprising the third electrode layer in FIG. 2 is arranged between the portion on the gap between the source and the drain of the TFT and the lower electrode of the photodetecting device via the insulating layer and connected to the first gate electrode 111 of the TFT comprising the first electrode layer, so that an influence of the photodetecting device can be prevented.

Figure 3:
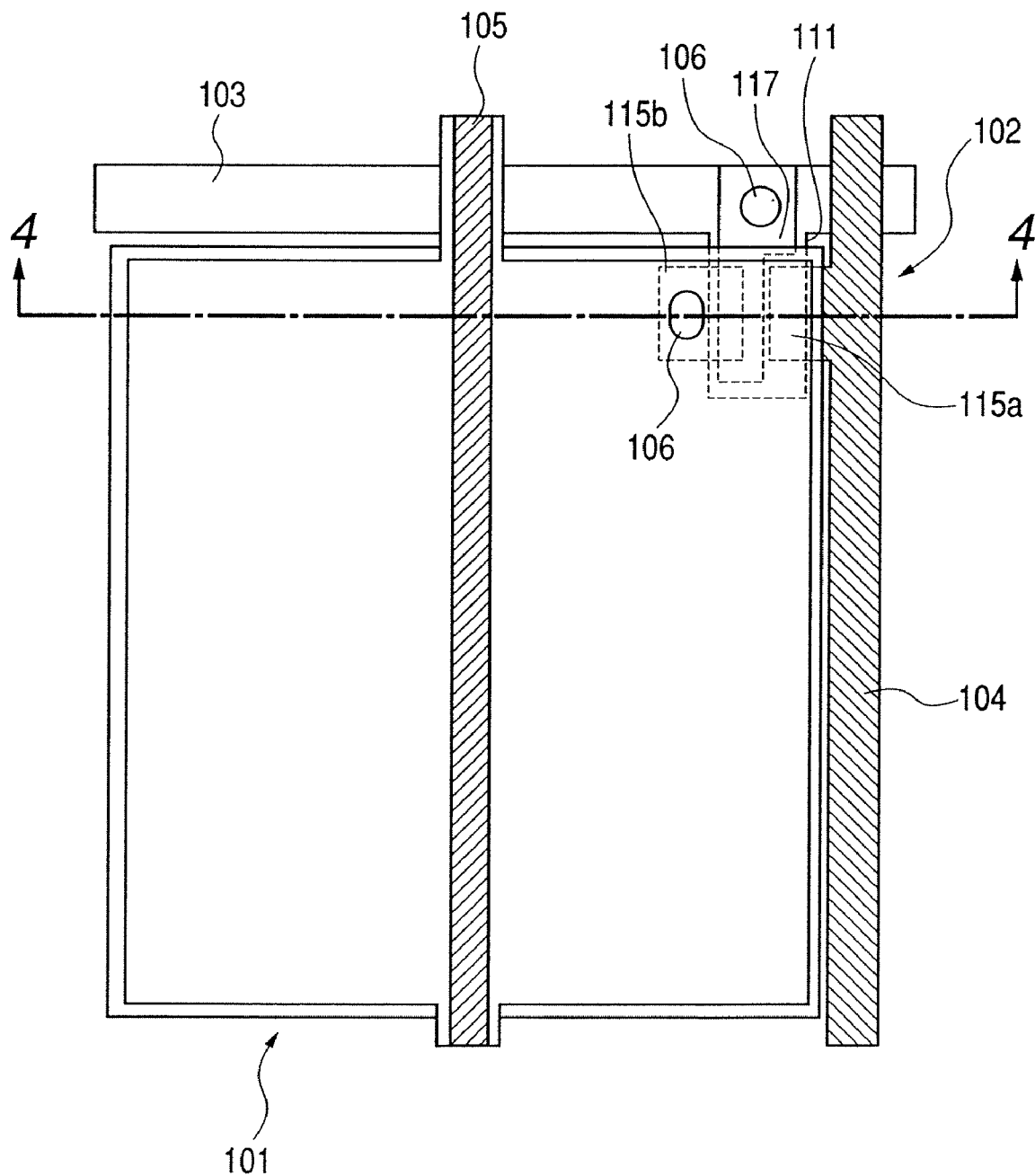
FIG. 3 is a plan view of a pixel of a solid state image pickup apparatus in another example of the embodiment 1 of the invention.

FIG. 3 is a layout diagram in which the characteristics have been further improved from those of the plane structure of the pixel in FIG. 1.

The TFT 102 is constructed by four electrodes: a source electrode; a drain electrode; a first gate electrode; and a second gate electrode. Particularly, in the photoelectric converting device comprising the photodetecting device and the TFT, it is known that when a capacitance of the transfer wiring 104 increases, noises increase at the time of reading out the charges generated in the photodetecting device. Therefore, as shown in FIG. 3, a channel portion between the source electrode and the drain electrode of the TFT is sandwiched by the first gate electrode 111 and the second gate electrode 117 and since the second gate electrode 117 does not overlap the source electrode 115*a* of the TFT, an influence on the TFT from the photodetecting device is prevented, a capacitance which is caused between the second gate electrode 117 and the transfer wiring 104 is reduced, and performance of the solid state image pickup apparatus is maintained.

Figure 4:
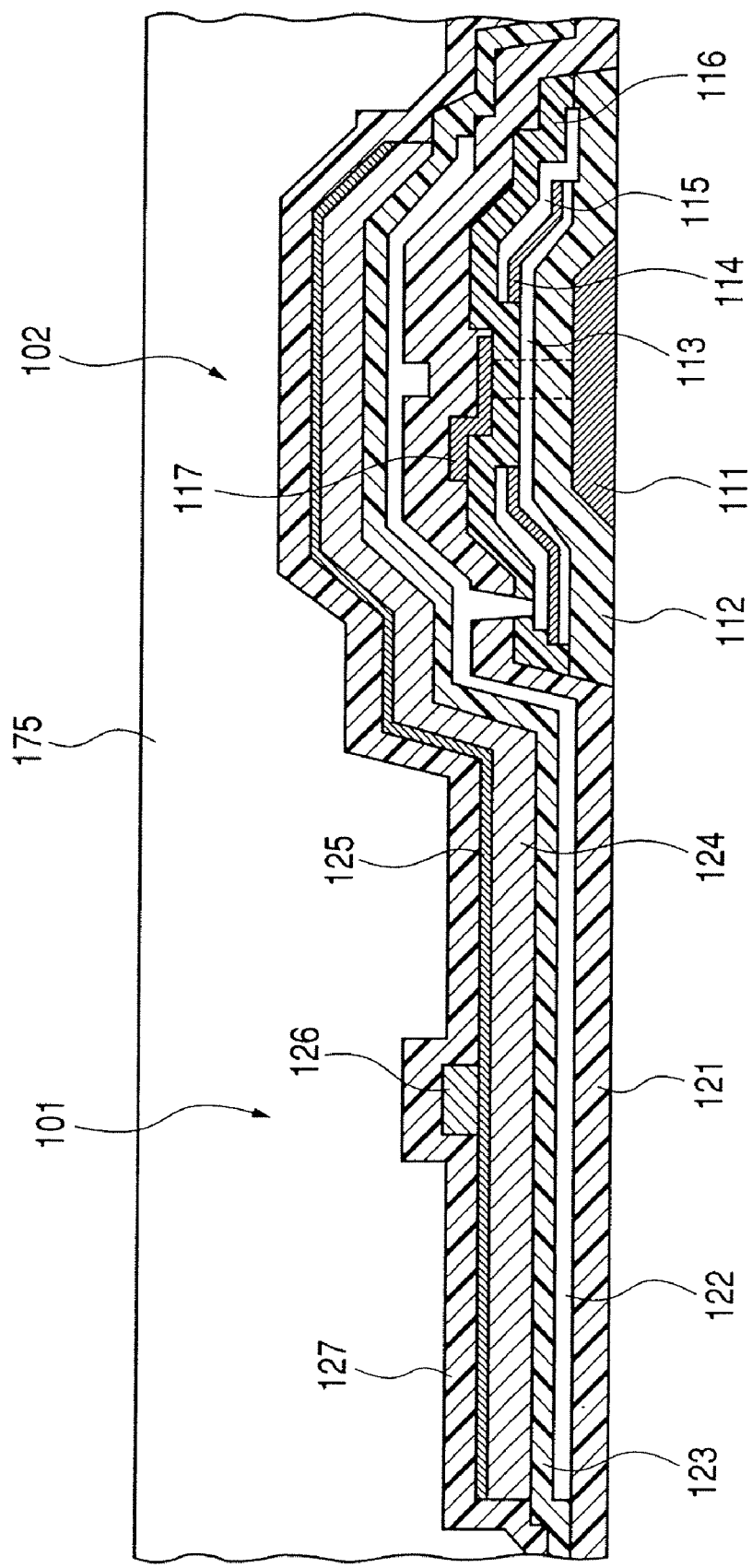
FIG. 4 is a cross sectional view taken along the line 4-4 in FIG. 3.

FIG. 4 is a cross sectional view taken along the line 4-4 in FIG. 3.

Each layer is formed on an insulating substrate (not shown). The second gate electrode 117 comprising the third electrode layer is arranged on the gap between the source and the drain of the TFT and connected to the first gate electrode 111 of the TFT 102 comprising the first electrode layer, so that the influence of the photodetecting device can be prevented. By arranging the second gate electrode so as not to overlap the source electrode 115*a* connected to the transfer wiring, a capacitance which is caused between the second gate electrode 117 and the source electrode 115*a* can be suppressed. Therefore, the capacitance of the transfer wiring 104 is minimized. It is also possible to arrange the second gate electrode 117 onto the source electrode 115*a* so that the first gate electrode does not overlap the source electrode 115*a*. If a transfer ability of the TFT is sufficient, it is also possible to arrange both of the second gate electrode 117 and the first gate electrode so as not to overlap the source electrode 115*a*.

A sensor panel of the solid state image pickup apparatus and its peripheral circuit will now be described.

Figure 5:
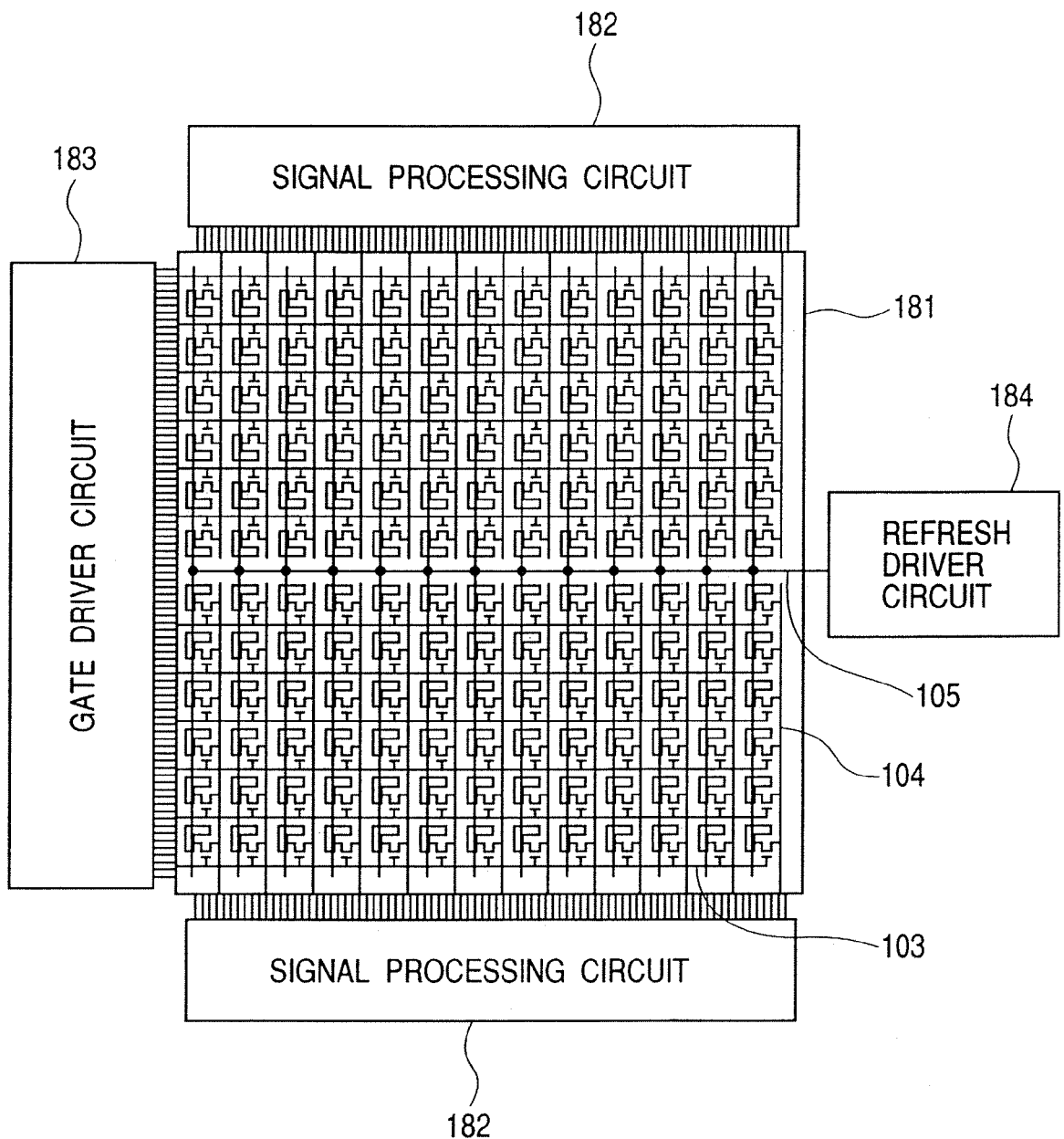
FIG. 5 is a simple equivalent circuit diagram of the solid state image pickup apparatus and its peripheral circuit diagram in the embodiment 1 of the invention.

FIG. 5 is a simple equivalent circuit diagram of the solid state image pickup apparatus and its peripheral circuit diagram in an embodiment 1 of the invention.

A sensor panel 181 including an equivalent circuit is arranged at the center and signal processing circuits 182, a gate driver circuit 183, and a refresh driver circuit 184 are arranged around the outside of the sensor panel 181. The transfer wiring 104 in the panel is processed by the signal processing circuits 182 arranged in the upper and lower positions in FIG. 5. The gate wiring 103 in the panel is controlled by the gate driver circuit 183. The bias wiring 105 in the panel is controlled by the refresh driver circuit 184. The refresh driver circuit 104 is vertically divided into two parts and connected to the upper and lower signal processing circuits 182, respectively. The bias wiring 105 is led to all pixels from the dividing position where it is vertically divided. The bias wiring 105 can be provided in the signal processing circuit and led. Although the gate wiring 103 is controlled by the gate driver circuit 183 arranged in the left portion, it is possible to arrange the gate driver circuits 183 to the right and left and control the gate wiring 103 from both directions or it is also possible to divide the gate wiring 103 in the center portion and independently control the divided right and left gate wirings.

Embodiment 2

Figure 6:
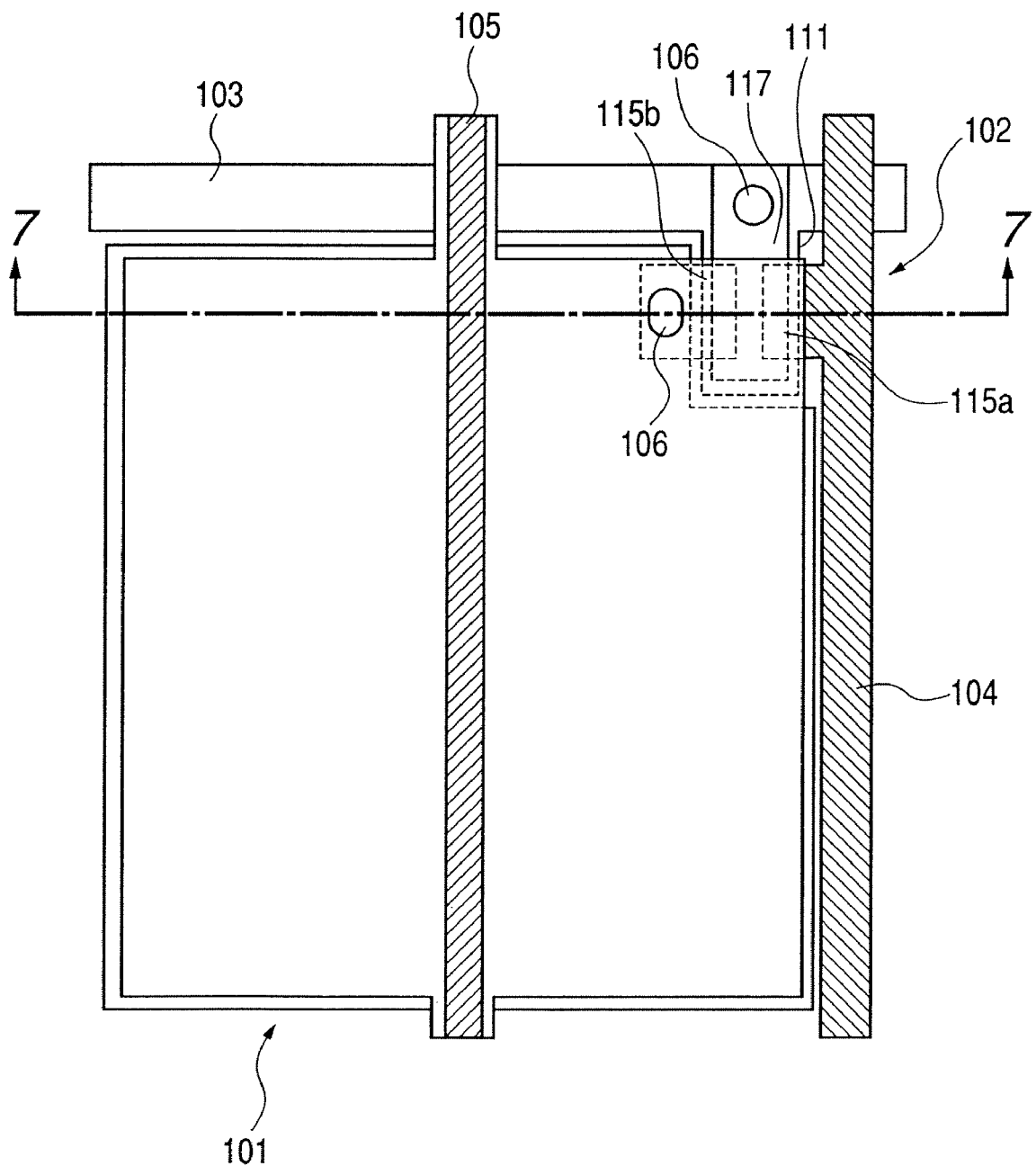
FIG. 6 is a plan view of a pixel of a solid state image pickup apparatus in an embodiment 2 of the invention.

FIG. 6 is a layout diagram showing a plane structure of a pixel including a pair of a photodetecting device and a TFT of a solid state image pickup apparatus in an embodiment 2 of the invention.

The photodetecting device of the embodiment is a device for converting visible light into charges. A phosphor layer serving as a wavelength converter for converting a radiation into visible light is arranged in an upper portion of the device.

A TFT (thin film transistor) 102 is constructed by four electrodes: a source electrode; a drain electrode; a first gate electrode; and a second gate electrode. The transfer wiring 104 connected to the signal processing circuit for reading out the accumulated charges is connected to the source electrode 115*a* of the TFT. The gate wiring 103 connected to the gate driver circuit 183 for controlling ON/OFF of the TFT is connected to the first gate electrode 111 of the TFT and also connected to the second gate electrode 117 via the throughhole 106 every pixel. Further, the photodetecting device 101 is an MIS type photodetecting device constructed sequentially from the bottom by the electrode layer, insulating layer, intrinsic semiconductor layer, and n-type semiconductor layer. One of the two electrodes constructing the photodetecting device is connected to the drain electrode 115*b* of the TFT and the other electrode is connected to the bias wiring 105 for applying a voltage to the sensor.

The lower electrode of the photodetecting device 101 is not arranged on the TFT 102 but the TFT 102 is constructed sequentially from the bottom by the insulating layer, intrinsic semiconductor layer, n-type semiconductor layer, and electrode layer. However, if the second gate electrode 117 does not exist, when the radiation enters, in the embodiment, the holes are accumulated into an interface of the insulating layer and the intrinsic semiconductor layer, particularly, on the source and drain electrodes, so that an influence is exercised on the TFT and it becomes a factor of changing the threshold voltage. Therefore, as shown in the diagram, by sandwiching the channel portion between the source electrode and the drain electrode of the TFT by the first gate electrode 111 and the second gate electrode 117, even if the electrons and holes are generated in the photodetecting device arranged in the upper portion of the TFT and the electrons and holes are accumulated in the interface of, particularly, the insulating film and the intrinsic semiconductor layer on the source and drain electrodes constructing the photodetecting device, the TFT existing in the lower portion is not influenced and the characteristics do not fluctuate.

In the embodiment, particularly, in the case where a material for photoelectrically converting the visible light is used for the photodetecting device, it is desirable that the light does not enter the gap portion between the source and the drain of the TFT. Therefore, it is desirable that a metal layer such as Al or Mo which is not formed in a transparent electrode layer such as ITO or the like and does not transmit the light is used for the lower electrode layer which is used for the lower electrode of the photodetecting device that is arranged in the upper portion of the TFT and for the electrode layer which is used as a second gate electrode of the TFT.

Figure 7:
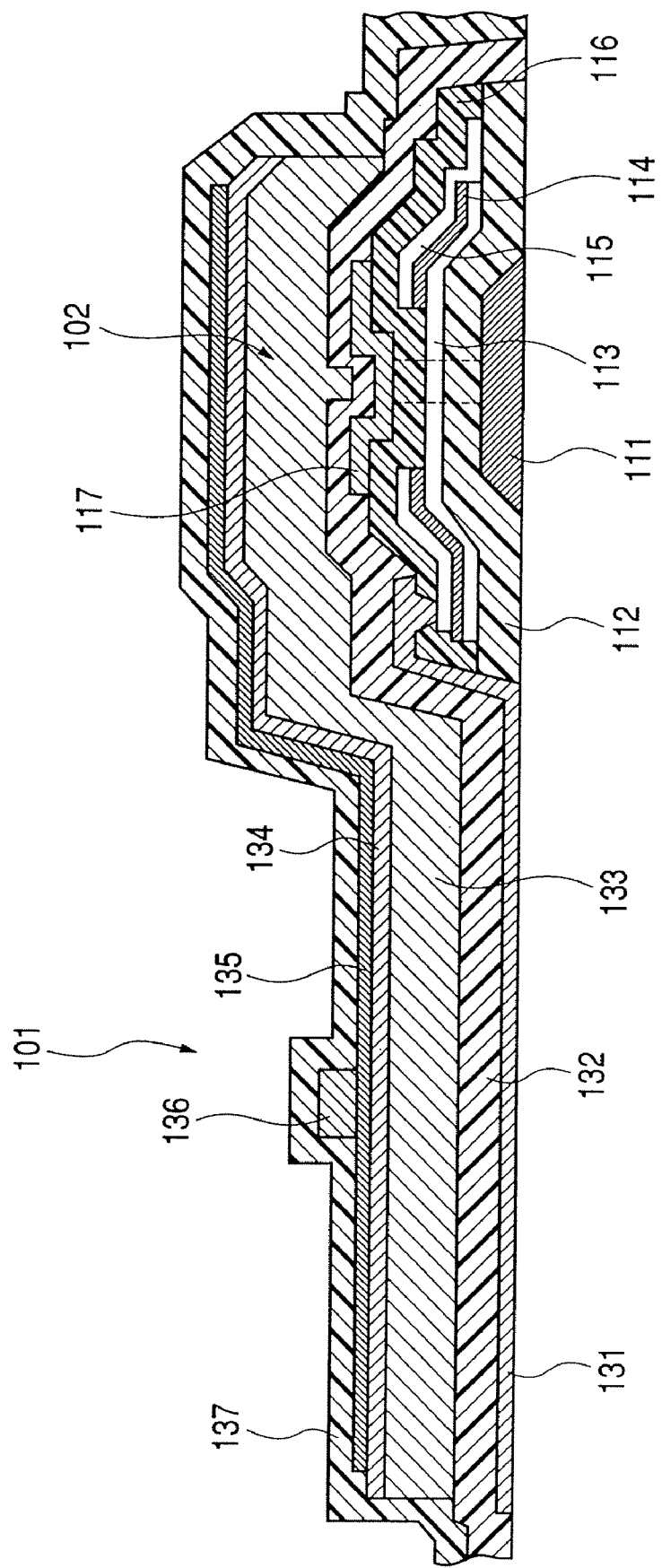
FIG. 7 is a cross sectional view taken along the line 7-7 in FIG. 6.

FIG. 7 is a cross sectional view taken along the line 7-7 in FIG. 6.

Each layer is formed on an insulating substrate (not shown). Although not shown, a phosphor layer is arranged in the upper portion. The TFT 102 is arranged in the right portion and the photodetecting device 101 is arranged in the left portion so as to cover the TFT 102 in the right portion. The TFT 102 has a structure of a bottom gate type and is constructed sequentially from the bottom by: the first gate electrode 111 comprising the first electrode layer; the source-drain electrodes comprising the first insulating layer 112, the first intrinsic semiconductor layer 113, the first n-type semiconductor layer 114, and the second electrode layer 115; and the second gate electrode 117 comprising the second insulating layer 116 and the third electrode layer.

The photodetecting device 101 is constructed sequentially from the bottom by: a third electrode layer 131; a third insulating layer 132; a second intrinsic semiconductor layer 133; a second n-type semiconductor layer 134; and a fourth electrode layer 135. A bias wiring comprising a fifth electrode layer 136 which has a low resistance and to which a bias can be applied is connected to the fourth electrode layer 135. It is preferable that, for example, an ITO layer serving as a transparent electrode layer for sufficiently transmitting the visible light is used as a fourth electrode layer 135. The second gate electrode 117 as a third electrode layer arranged in the upper portion of the TFT 102 is formed simultaneously with the third electrode layer 131 as the same layer as the lower electrode layer of the photodetecting device. The drain electrode 115b of the TFT is connected to the electrode comprising the third electrode layer 131 of the photodetecting device. A fourth insulating layer 137 is, arranged in the upper portion.

In the solid state image pickup apparatus having such a construction, when the visible light converted from the radiation by the phosphor enters the photodetecting device, electrons and holes are generated in the intrinsic semiconductor layer. If the second gate electrode does not exist here, for example, if the fourth electrode layer 135 of the photodetecting device is fixed to a predetermined electric potential, the lower electrode of the photodetecting device comprising the third electrode layer 131 causes a potential fluctuation, and at the same time, the holes are accumulated in the interface of the third insulating layer 132 and the second intrinsic semiconductor layer 133 on the source and drain electrodes of the TFT. The back channel effect of the TFT is caused by such an influence and the threshold voltage of the TFT is changed. Therefore, the second gate electrode 117 comprising the third electrode layer in FIG. 7 is arranged between the portion on the gap between the source and the drain of the TFT and the photodetecting device via the insulating film and connected to the first gate electrode 111 of the TFT comprising the first electrode layer, so that the influence of the photodetecting device can be prevented.

Embodiment 3

Figure 8:
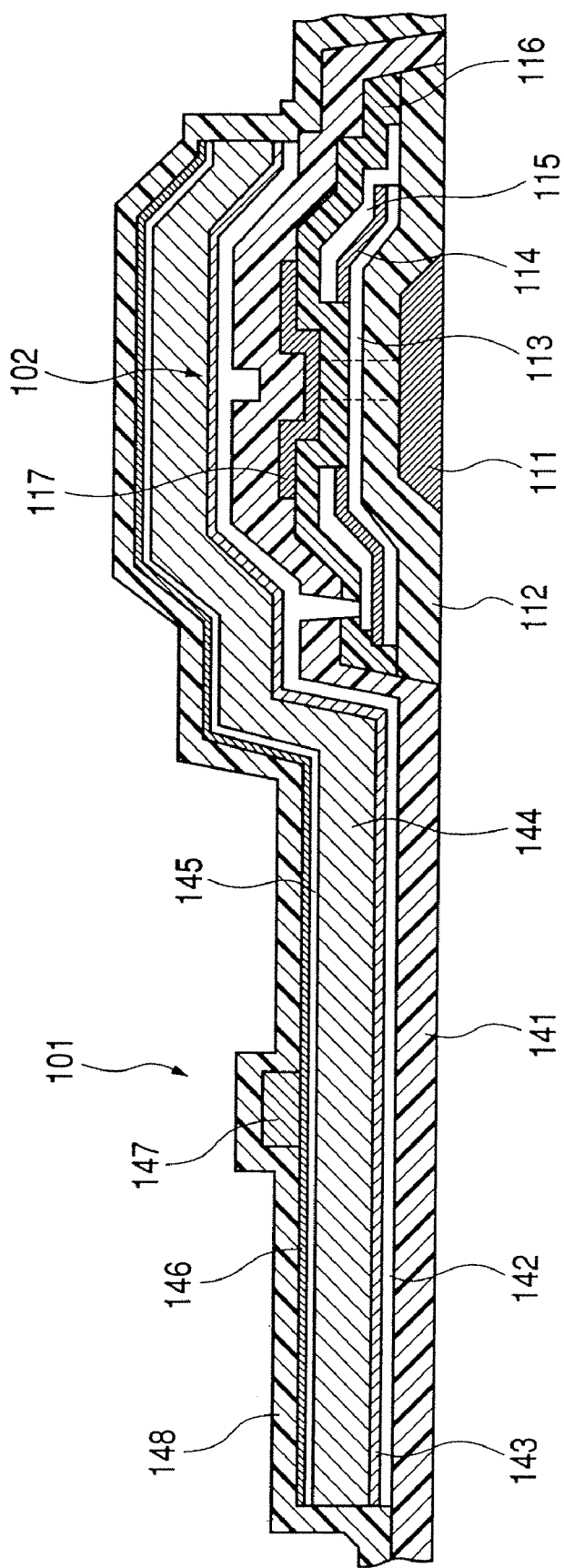
FIG. 8 is a cross sectional view of a pixel of a solid state image pickup apparatus in an embodiment 3 of the invention.

FIG. 8 is a cross sectional view of a pixel including a pair of a photodetecting device and a TFT of a solid state image pickup apparatus in an embodiment 3 of the invention.

A layout diagram showing a plane structure is similar to that in the embodiment 1. The photodetecting device in the embodiment is a device for converting the visible light into charges and each layer is formed on an insulating substrate (not shown). A phosphor layer (not shown) for converting the radiation into the visible light is arranged in an upper portion.

The TFT 102 is arranged in the right portion and the photodetecting device 101 is arranged in the left portion so as to cover the TFT 102 in the right portion. The TFT 102 has a structure of a bottom gate type and is constructed sequentially from the bottom by: the first gate electrode 111 comprising the first electrode layer; the source-drain electrodes comprising the first insulating layer 112, the first intrinsic semiconductor layer 113, the first n-type semiconductor layer 114, and the second electrode layer 115; and the second gate electrode 117 comprising the second insulating layer 116 and the third electrode layer.

The photodetecting device 101 is a PIN-type photodetecting device constructed sequentially from the bottom by: a fourth electrode layer 142; a second n-type semiconductor layer 143; a second intrinsic semiconductor layer 144; a p-type semiconductor layer 145; and a fifth electrode layer 146. A bias wiring comprising a sixth electrode layer 147 which has a low resistance and to which a bias can be applied is connected to the fifth electrode layer 146. It is preferable that, for example, an ITO layer serving as a transparent electrode layer for sufficiently transmitting the visible light is used as a fifth electrode layer 146. The drain electrode of the TFT is connected to the electrode comprising the fourth electrode layer 142 of the photodetecting device. The third insulating electrode 132 is arranged in the lower portion and a fourth insulating layer 148 is arranged in the upper portion.

In the solid state image pickup apparatus having such a construction, when the visible light converted from the radiation by the phosphor enters the photodetecting device 101, electrons and holes are generated in the intrinsic semiconductor layer. If the second gate electrode 117 does not exist here, for example, if the fifth electrode layer 146 of the photodetecting device 101 is fixed to a predetermined electric potential, the lower electrode of the photodetecting device comprising the fourth electrode layer 142 causes a potential fluctuation. The back channel effect of the TFT is caused by such an influence and the threshold voltage of the TFT is changed. Therefore, the second gate electrode 117 comprising the third electrode layer in FIG. 8 is arranged between the portion on the gap between the source and the drain of the TFT and the lower electrode of the photodetecting device 101 via the insulating film and connected to the first gate electrode 111 of the TFT comprising the first electrode layer, so that the influence of the photodetecting device 101 can be prevented.

In the embodiment, the photodetecting device can be also replaced with a direct converting material for directly and photoelectrically converting the radiation. In this case, there is no need to arrange the phosphor layer (not shown) which is arranged in the upper portion disclosed above.

Embodiment 4

Figure 9:
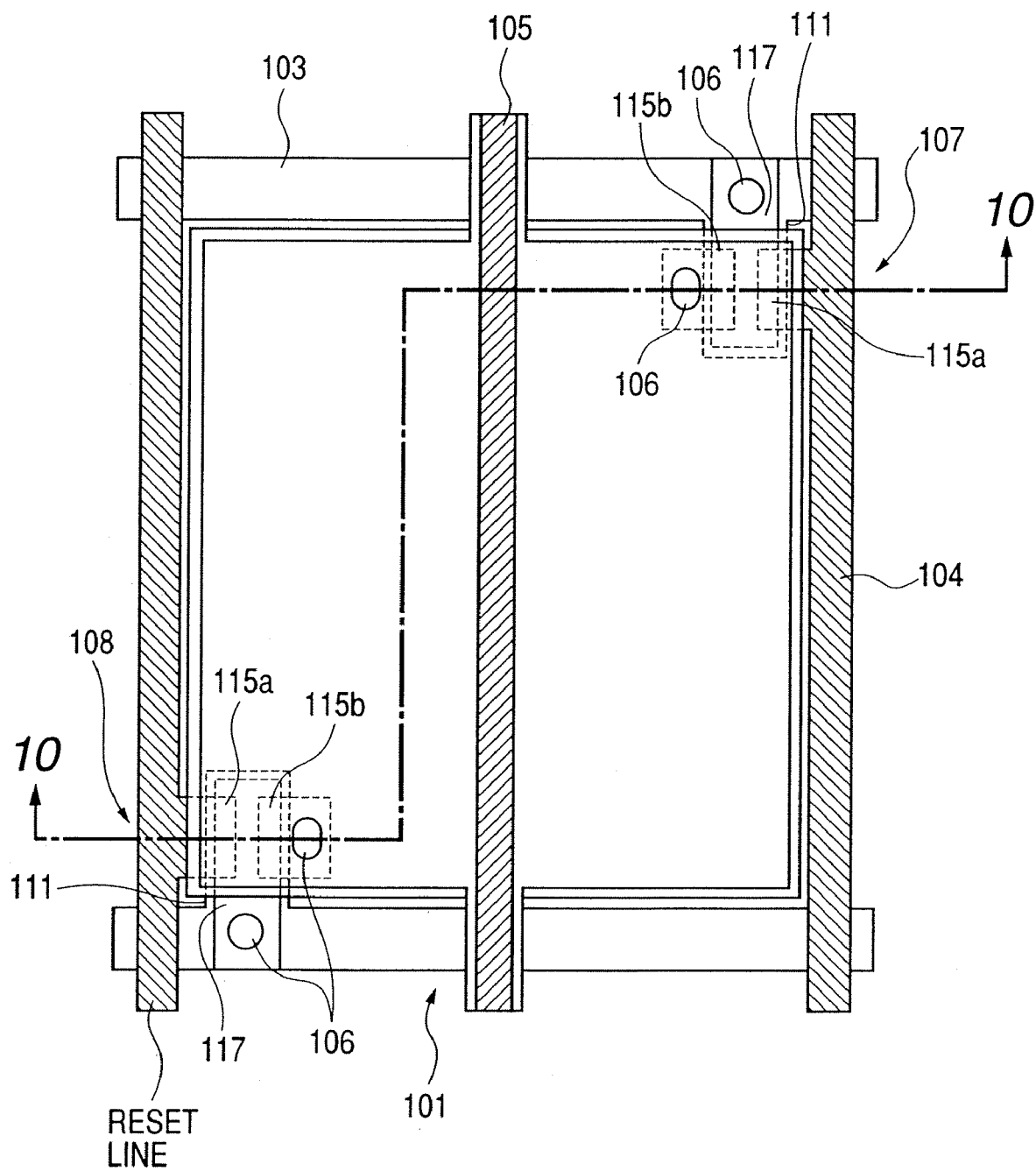
FIG. 9 is a plan view of a pixel of a solid state image pickup apparatus in an embodiment 4 of the invention.

FIG. 9 is a layout diagram showing a plane structure of a pixel comprising one photodetecting device and two TFTs constructing a pair in a solid state image pickup apparatus in an embodiment 4 of the invention.

The photodetecting device in the embodiment is a device for converting the visible light into charges and a phosphor layer for converting the radiation into the visible light is arranged in an upper portion of the device.

Each of TFTs 107 and 108 is constructed by four electrodes: a source electrode; a drain electrode; a first gate electrode; and a second gate electrode. The TFT 107 in an upper right position is arranged to transfer the charges accumulated in the photodetecting device 101 to the signal processing circuit. The TFT 108 in a lower left position is arranged to transfer the charges accumulated in the photodetecting device 101 and, thereafter, reset the photodetecting device 101. The transfer wiring 104 connected to the source electrode 115a is led to the signal processing circuit for reading out the accumulated charges. The gate wiring 103 connected to the gate driver circuit for controlling ON/OFF of the TFT is connected to the first gate electrode 111 of the TFT and also connected to the second gate electrode 117 via the through-hole 106 every pixel.

Further, the photodetecting device 101 is an MIS type photodetecting device constructed sequentially from the bottom by an electrode layer, an insulating layer, an intrinsic semiconductor layer, and an n-type semiconductor layer. One of the two electrodes constructing the photodetecting device is connected to drain electrodes of the two TFTs and the other electrode is connected to the bias wiring 105 for applying a voltage to the sensor. If the second gate electrode 117 does not exist here, when the radiation enters, the lower electrode of the photodetecting device causes a potential fluctuation, so that the TFT is influenced and it becomes a factor which changes the threshold voltage. Therefore, as shown in the diagram, in the TFTs in both of the upper right portion and the lower left portion, by sandwiching the channel portion between the source electrode and the drain electrode by the first gate electrode 111 and the second gate electrode 117, even if the visible light converted from the radiation is irradiated to the photodetecting device arranged in the upper portion of the TFT, the TFT existing in the lower portion is not influenced and the characteristics do not fluctuate.

In the embodiment, particularly, in the case where a material for photoelectrically converting the visible light is used as a photodetecting device, it is desirable that the light does not enter the gap portion between the source and the drain of the TFT. Therefore, a lower electrode layer which is used for the lower electrode of the photodetecting device which is arranged in the upper portion of the TFT or the electrode layer which is used as a second gate electrode of the TFT is not formed by a transparent electrode layer such as ITO or the like but it is desirable to use a metal layer such as Al or Mo which does not transmit the light.

Figure 10:
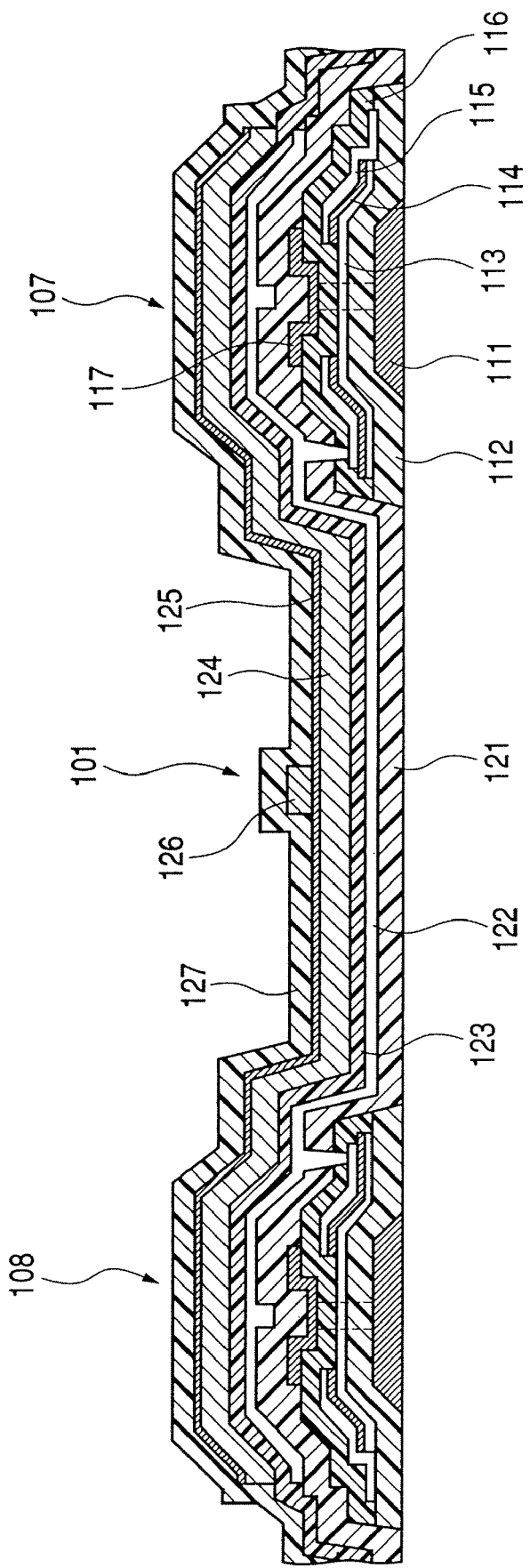
FIG. 10 is a cross sectional view taken along the line 10-10 in FIG. 9.

FIG. 10 is a cross sectional view taken along the line 10-10 in FIG. 9.

Each layer is formed on an insulating substrate (not shown). The photodetecting device 101 is arranged in the upper portion so as to cover the right and left TFTs. The TFT 107 for transfer is arranged in the right portion and the TFT 108 for resetting is arranged in the left portion. Both of the TFTs have a structure of a bottom gate type and each TFT is constructed sequentially from the bottom by: the first gate electrode 111 comprising the first electrode layer; the source-drain electrodes comprising the first insulating layer 112, the first intrinsic semiconductor layer 113, the first n-type semiconductor layer 114, and the second electrode layer 115; and the second gate electrode 117 comprising the second insulating layer 116 and the third electrode layer.

The photodetecting device is constructed sequentially from the bottom by: the fourth electrode layer 122; the fourth insulating layer 123; the second intrinsic semiconductor layer 124; the 2nd n-type semiconductor layer 125; and the fifth electrode layer 126. A bias wiring comprising a sixth electrode layer 128 which has a low resistance and to which a bias can be applied is connected to the fifth electrode layer 126. It is preferable that, for example, an ITO layer serving as a transparent electrode layer for sufficiently transmitting the visible light is used as a fifth electrode layer 126. The drain electrode of the TFT is connected to the electrode comprising the fourth electrode layer 122 of the photodetecting device. The third insulating layer 121 is arranged in the lower portion and the fifth insulating layer 127 is arranged in the upper portion.

In the solid state image pickup apparatus having such a construction, when the visible light converted from the radiation by the phosphor enters the photodetecting device, electrons and holes are generated in the intrinsic semiconductor layer. If the second gate electrode 117 does not exist here, for example, if the second n-type semiconductor layer of the photodetecting device is fixed to a predetermined electric potential, the lower electrode of the photodetecting device comprising the fourth electrode layer causes a potential fluctuation, so that the back channel effect of the TFT is caused by such an influence and the threshold voltage of the TFT is changed. Therefore, the second gate electrode 117 comprising the third electrode layer in FIG. 10 is arranged between the portion on the gap between the source and the drain of each of the right and left TFTs and the lower electrode of the photodetecting device via the insulating film and connected to the first gate electrode 111 of the TFT comprising the first electrode layer, so that the influence of the photodetecting device can be prevented.

In the embodiment, the photodetecting device can be replaced with a PIN-type photodetecting device or can be also replaced with a direct converting material for directly and photoelectrically converting the radiation. In the case of using the direct converting material, there is no need to arrange the phosphor layer (not shown) which is arranged in the upper portion disclosed above.

Embodiment 5

Figure 11:
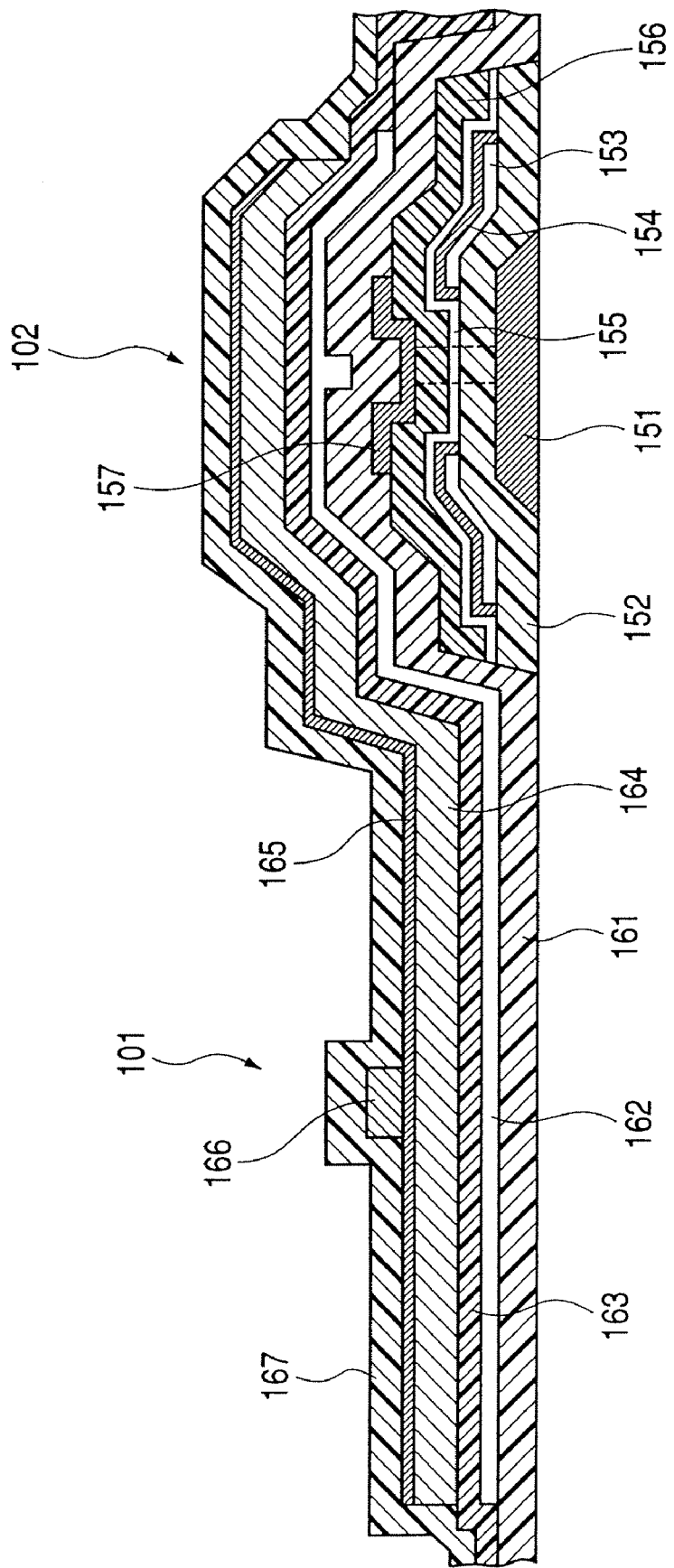
FIG. 11 is a cross sectional view of a pixel of a solid state image pickup apparatus in an embodiment 5 of the invention.

FIG. 11 is a cross sectional view of a pixel including a pair of a photodetecting device and a TFT of a solid state image pickup apparatus in an embodiment 5 of the invention.

A layout diagram showing a plane structure is similar to that in the embodiment 1. The photodetecting device in the embodiment is a device for converting the visible light into charges and each layer is formed on an insulating substrate (not shown). A phosphor layer (not shown) for converting the radiation into the visible light is arranged in an upper portion.

The TFT 102 is arranged in a right portion. The photodetecting device 101 is arranged in a left portion so as to cover the TFT 102 in the right portion. The TFT 102 has a structure of a top gate type and is constructed sequentially from the bottom by: a first gate electrode 151 comprising the first electrode layer; source-drain electrodes comprising a second electrode layer 153; a second gate electrode 157 comprising a first n-type semiconductor layer 154, a first intrinsic semiconductor layer 155, a second insulating layer 156, and a third electrode layer; and a third insulating layer 161. A first insulating layer 152 is formed in the lower portion of the source and drain electrodes so that the insulating substrate and the channel portion are not come into direct contact with each other. The first gate electrode 151 as a first electrode layer is arranged between the first insulating layer 152 and the insulating substrate. The device is not influenced by the microions included in the insulating substrate.

The photodetecting device 101 is constructed sequentially from the bottom by: a fourth electrode layer 162; a fourth insulating layer 163; a second intrinsic semiconductor layer 164; a second n-type semiconductor layer 165; and a fifth electrode layer 166. A bias wiring comprising a sixth electrode layer which has a low resistance and to which a bias can be applied is connected to the fifth electrode layer 166. It is preferable that, for example, an ITO layer serving as a transparent electrode layer which sufficiently transmits the visible light is used as a fifth electrode layer 166. The drain electrode of the TFT 102 is connected to an electrode comprising the fourth electrode layer 162 of the photodetecting device 101. A third insulating layer 161 is arranged in a lower portion. A fifth insulating layer 167 is arranged in an upper portion.

In the solid state image pickup apparatus of such a structure, when the visible light converted in the phosphor from the radiation enters the photodetecting device 101, electrons and holes are generated in the intrinsic semiconductor layer. If the second gate electrode 157 does not exist, for example, if the fifth electrode layer 166 of the photodetecting device has been fixed to a predetermined electric potential, a potential fluctuation is caused in the lower electrode of the photodetecting device comprising the fourth electrode layer 162. The back channel effect of the TFT is caused by such an influence and a threshold voltage of the TFT is changed. Therefore, the second gate electrode 157 comprising the third electrode layer in FIG. 11 is arranged between the portion on the gap between the source and the drain of the TFT and the lower electrode of the photodetecting device via the insulating layer and connected to the first gate electrode 151 of the TFT comprising the first electrode layer, thereby enabling an influence of the photodetecting device to be prevented.

In the embodiment, the photodetecting device can be replaced with a direct converting material for directly and photoelectrically converting the radiation. In this case, there is no need to arrange the phosphor layer (not shown) which is arranged in the upper portion disclosed above.

Embodiment 6

Figure 12:
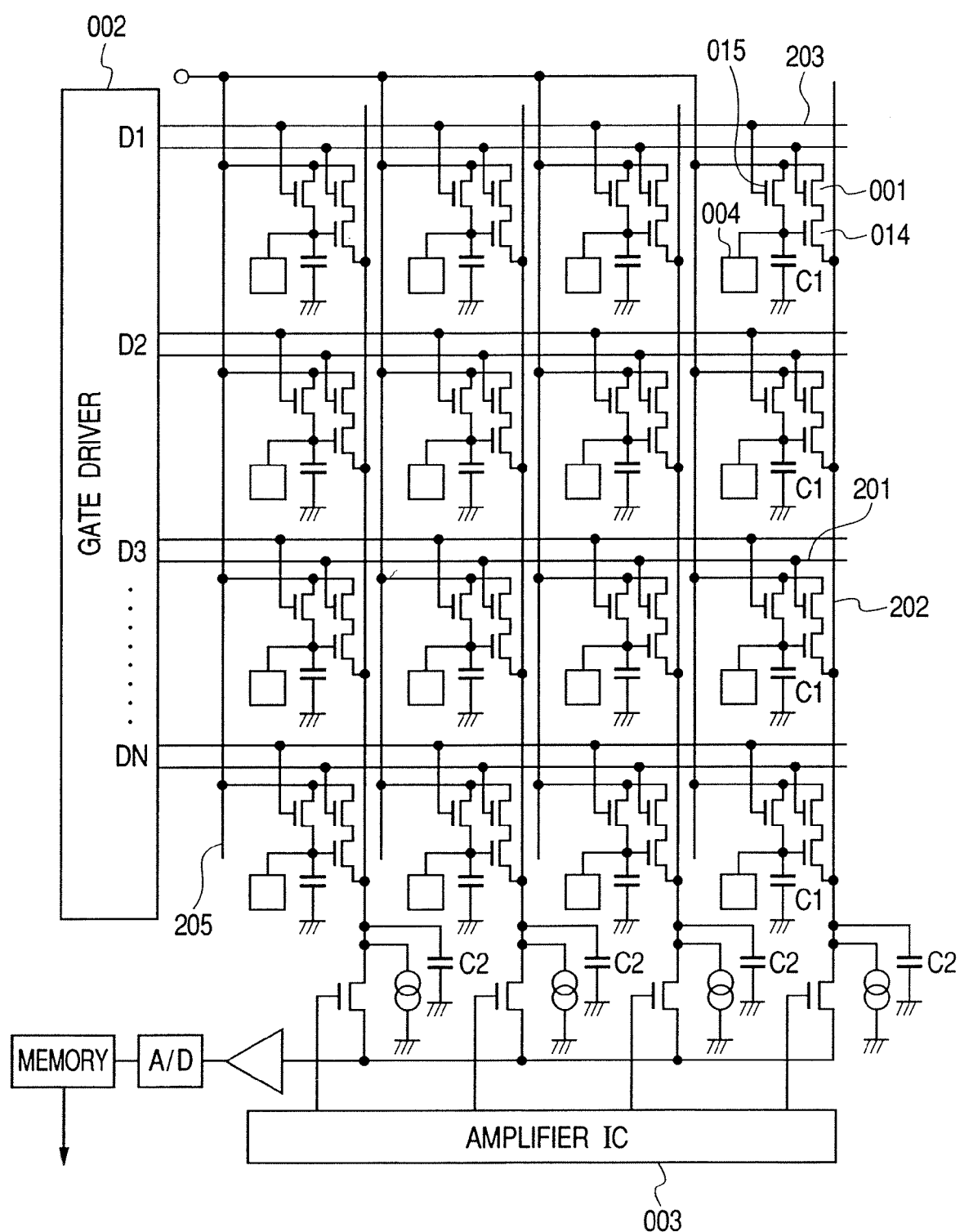
FIG. 12 is a schematic equivalent circuit diagram in an embodiment 6 of the invention.

FIG. 12 is a schematic equivalent circuit diagram in an embodiment 6 of the invention.

Explanation will now be made with respect to an example in which a TFT for switching, an MIS type photodetecting device, and a TFT for reading comprising a gate which receives charges generated in the MIS type photodetecting device and source and drain electrodes for reading out a signal according to an amount of charges are formed by using five layers of flat films and metal films.

In FIG. 12, a common drive wiring 201 of a switching TFT 001 is connected to a gate driver 002 for controlling ON/OFF of the switching TFT 001. Further, a source or drain electrode of the TFT 001 is connected to a common signal wiring 202 via a reading TFT 014. The signal wiring 202 is connected to an amplifier IC 003. One of electrodes of a photodetecting device 004 is connected to a common electrode driver (not shown) and the other electrode is connected to a control electrode (gate electrode) of the reading TFT 014. A control electrode of a resetting TFT 015 is connected to a drive wiring 203, either a source electrode or a drain electrode is connected to the control electrode of the reading TFT 014, and the other electrode is connected to a resetting wiring 205.

The radiation which entered a specimen is attenuated by the specimen, transmits, and is converted into visible light by the phosphor layer. The visible light enters the photodetecting device 004 and converted into charges. The charges cause a potential fluctuation according to a light irradiation amount in the control electrode of the reading TFT 014. An amount of current flowing in the reading TFT 014 is changed due to the potential fluctuation and can be read out via the signal wiring 202. The switching TFT 001 is used as a switching transistor for applying a voltage across a source and a drain of the reading TFT 014. The signal is transferred to the signal wiring 202 and read out to the outside by the amplifier IC 003. After the signal was read out, by driving the resetting TFT 015 and applying a voltage to the electrodes of the photodetecting device 004 connected to the resetting TFT 015 via the reset wiring 205, the charges accumulated in the photodetecting device can be removed.

In such a solid state image pickup apparatus of the source follower type, it is necessary to arrange a plurality of TFTs (for example, the reading TFT and the resetting TFT in the embodiment) besides the TFT including the first intrinsic semiconductor layer and the photodetecting device including the second intrinsic semiconductor layer. A capacitor can be arranged in the circuit. In such a case, the number of variations of design can be increased by forming them by the five layers of flat films and metal films as mentioned above. For example, it is possible to use a free layout such that the switching TFT, resetting TFT, and capacitor are formed in the lower layer and the photodetecting device and the reading TFT are formed in the upper layer, or the like.

However, when the visible light enters the photodetecting device arranged in the upper portion or when the TFT likewise arranged in the upper portion is made operative, the back channel effect is caused in the TFT arranged in the lower portion. Such a phenomenon typically occurs, particularly, in the bottom gate type TFT. If the photodetecting device or the TFT is arranged in the portion on the channel portion between the source and the drain, the threshold voltage of the TFT is not stabilized but a leakage between the source and the drain is caused. Therefore, by arranging the first gate electrode and the second gate electrode so as to sandwich the source and the drain and connecting and driving them every pixel, the TFT can be protected against the ambient external action.

According to the embodiments, the stable TFT can be provided in the solid state image pickup apparatus comprising, at least: the TFTs (for example, the switching TFT and the resetting TFT) including the first intrinsic semiconductor layer; and the photodetecting device including the second intrinsic semiconductor layer arranged on the upper surface of them and the electrode.

Although the structure in which the first gate electrode and the second gate electrode are connected, connected to the same gate driver, and driven has been shown in each of the above embodiments, it is also possible to connect the first gate electrode and the second gate electrode to different drivers and, for example, change a value of a voltage which is applied.

Embodiment 7

A manufacturing method of a solid state image pickup apparatus of the invention will be described in the embodiment 7.

The manufacturing method of the solid state image pickup apparatus characterized in that the apparatus comprises a substrate, a photodetecting device arranged on the substrate, and a plurality of thin film transistors connected to the photodetecting device, a part of the photodetecting device is arranged so as to overlap at least a part of the thin film transistor, and the thin film transistor comprises a source electrode, a drain electrode, a first gate electrode, and a second gate electrode arranged on the side opposite to the first gate electrode as a bottom electrode with respect to the source electrode and the drain electrode comprises the following steps (1) to (7).

(1) Step of forming a sensor electrode of the photodetecting device and a conductive film for the gate electrodes of the thin film transistor onto the substrate.

(2) Step of forming the sensor electrode of the photodetecting device and the first gate electrode of the thin film transistor by patterning the conductive film.

(3) Step of forming a common electrode of the photodetecting device and a conductive film for the source electrode and the drain electrode of the thin film transistor into an upper portion of the substrate.

(4) Step of forming the common electrode by patterning the conductive film.

(5) Step of forming the source electrode and the drain electrode of the thin film transistor by further patterning the conductive film.

(6) Step of forming a conductive film for the second gate electrode into a further upper portion of an insulating film on the conductive film.

(7) Step of forming the second gate electrode by patterning the conductive film.

The embodiments of the invention have been described above. Preferred embodiments of the invention will be mentioned as follows.

Embodiment 1

A solid state image pickup apparatus characterized in that a photodetecting device and one or more thin film transistors connected to the photodetecting device are formed in one pixel, a part of the photodetecting device is formed over at least a part of the thin film transistor, and the thin film transistor comprises a source electrode, a drain electrode, a first gate electrode, and a second gate electrode arranged on the side opposite to the first gate electrode with respect to the source electrode and the drain electrode.

Embodiment 2

A solid state image pickup apparatus according to Embodiment 1, characterized in that the thin film transistor is a double gate type thin film transistor comprising at least the first gate electrode, an insulating layer, a semiconductor layer, a semiconductor layer having an impurity doped, the source and drain electrodes, an insulating layer, and the second gate electrode which are sequentially formed onto an insulating substrate.

Embodiment 3

A solid state image pickup apparatus according to Embodiment 1 or 2, characterized in that the second gate electrode covers at least a part of a gap portion between the source electrode and the drain electrode.

Embodiment 4

A solid state image pickup apparatus according to any one of Embodiments 1 to 3, characterized in that either the source electrode or the drain electrode is connected to a transfer wiring connected to a signal processing circuit, and the second gate electrode does not two-dimensionally overlap either the source electrode or the drain electrode connected to the transfer wiring.

Embodiment 5

A solid state image pickup apparatus according to any one of Embodiments 1 to 4, characterized in that the second gate electrode and the first gate electrode are connected to one gate driver circuit by a gate wiring and controlled by the gate driver circuit.

Embodiment 6

A solid state image pickup apparatus according to any one of Embodiments 1 to 5, characterized in that the second gate electrode is formed as a film simultaneously with an electrode material constructing the photodetecting device.

Embodiment 7

A solid state image pickup apparatus according to any one of Embodiments 1 to 6, characterized in that the photodetecting device is constructed by at least an insulating layer, a semiconductor layer, and a semiconductor layer having a impurity doped.

Embodiment 8

A solid state image pickup apparatus according to any one of Embodiments 1 to 6, characterized in that the photodetecting device is constructed by at least a first semiconductor layer having a impurity doped, a semiconductor layer, and a second semiconductor layer having a impurity doped of a conductivity type opposite to that of the first semiconductor layer having a impurity doped.

Embodiment 9

A radiation image pickup apparatus characterized in that the photodetecting device of the solid state image pickup apparatus according to any one of Embodiments 1 to 6 is a radiation detecting device for directly and photoelectrically converting a radiation.

Embodiment 10

A radiation image pickup apparatus characterized in that a wavelength converter is arranged onto the photodetecting device of the solid state image pickup apparatus according to any one of Embodiments 1 to 8.

Embodiment 11

A manufacturing method of a solid state image pickup apparatus which has a substrate, a photodetecting device arranged on the substrate, and a plurality of thin film transistors connected to the photodetecting device, and in which a part of the photodetecting device is formed over at least a part of the thin film transistor, and the thin film transistor comprises a source electrode, a drain electrode, a first gate electrode, and a second gate electrode arranged on the side opposite to the first gate electrode as a bottom electrode with respect to the source electrode and the drain electrode, characterized by comprising the steps of:

forming a sensor electrode of the photodetecting device and a conductive film for the gate electrodes of the thin film transistor onto the substrate;

forming the sensor electrode of the photodetecting device and the first gate electrode of the thin film transistor by patterning the conductive film;

forming a common electrode of the photodetecting device and a conductive film for the source electrode and the drain electrode of the thin film transistor into an upper portion of the substrate;

forming the common electrode by patterning the conductive film;

forming the source electrode and the drain electrode of the thin film transistor by further patterning the conductive film;

forming a conductive film for the second gate electrode into a further upper portion of an insulating film on the conductive film; and forming the second gate electrode by patterning the conductive film.

As described above, according to the invention, in the solid state image pickup apparatus which comprises the photodetecting device and the TFT and in which the photodetecting device is arranged so as to overlap a part or whole surface of the TFT, by sandwiching the gap portion between the source and drain electrodes of the TFT by the first and second gate electrodes arranged vertically, the threshold voltage of the TFT is not changed due to the external action of the photodetecting device arranged in the upper portion and the stable TFT characteristics can be assured.

As many apparently widely different embodiments of the present invention can be made without departing from the spirit and scope thereof, it is to be understood that the invention is not limited to the specific embodiments thereof except as defined in the claims.

The invention claimed is:

1. A solid state image pickup apparatus comprising:
a photodetecting device and one or more thin film transistors connected to said photodetecting device formed in one pixel, wherein a part of said photodetecting device is formed over at least a part of said thin film transistor,
wherein said thin film transistor comprises a source electrode, a drain electrode, a semiconductor layer, a first gate electrode, and a second gate electrode arranged, on the side opposite to said first gate electrode with respect to a channel portion of the semiconductor layer, to have an upper surface higher than the source electrode and the drain electrode, and
wherein said first gate electrode and said second gate electrode are connected to a common gate wiring.

2. The solid state image pickup apparatus according to claim 1, wherein said thin film transistor is a double gate type thin film transistor comprising at least said first gate electrode, an insulating layer, said semiconductor layer, said semiconductor layer having an impurity doped therein, said source and drain electrodes, an insulating layer, and said second gate electrode which are sequentially formed onto an insulating substrate.

3. The solid state image pickup apparatus according to claim 1, wherein said second gate electrode covers at least a part of a gap portion between said source electrode and said drain electrode.

4. The solid state image pickup apparatus according to claim 1, wherein either said source electrode or said drain electrode is connected to a transfer wiring connected to a signal processing circuit, and said second gate electrode does not two-dimensionally overlap either said source electrode or said drain electrode connected to the transfer wiring.

5. The solid state image pickup apparatus according to claim 1, wherein said second gate electrode and said first gate electrode are connected to one gate driver circuit by a gate wiring and controlled by said gate driver circuit.

6. The solid state image pickup apparatus according to claim 1, wherein said second gate electrode is formed as a film simultaneously with an electrode material constructing said photodetecting device.

7. The solid state image pickup apparatus according to claim 1, wherein said photodetecting device comprises at least an insulating layer, a semiconductor layer, and a semiconductor layer having an impurity doped therein.

8. The solid state image pickup apparatus according to claim 1, wherein said photodetecting device comprises at least a first semiconductor layer having an impurity doped therein, a semiconductor layer, and a second semiconductor layer having an impurity doped therein of a conductivity type opposite to that of said first semiconductor layer having a impurity doped therein.

9. A radiation image pickup apparatus comprising the photodetecting device of the solid state image pickup apparatus according to claim 1, as a radiation detecting device for directly and photoelectrically converting a radiation.

10. A radiation image pickup apparatus comprising the photodetecting device of the solid state image pickup apparatus according to claim 1, and a wavelength convert arranged onto said photodetecting device.

11. A solid state image pickup apparatus according to claim 1, wherein said second gate electrode is arranged between the source electrode and the drain electrode.

12. A solid state image pickup apparatus comprising:
a photodetecting device and one or more thin film transistors connected to said photodetecting device formed in one pixel, wherein a part of said photodetecting device is formed over at least a part of said thin film transistor,
wherein said thin film transistor comprises a source electrode, a drain electrode, a semiconductor layer, a first gate electrode on the bottom, and a second gate electrode on the top lying above a channel portion between the source electrode and the drain electrode, and
wherein said first gate electrode and said second gate electrode are connected to a common gate wiring.

* * * * *